United States Patent
Kobayashi et al.

(10) Patent No.: US 6,577,209 B2
(45) Date of Patent: Jun. 10, 2003

(54) SURFACE ACOUSTIC WAVE DEVICE WITH INDUCTOR MEANS FOR CORRECTING IMPEDANCE IMBALANCE BETWEEN INPUT AND OUTPUT ELECTRODES

(75) Inventors: Yasumi Kobayashi, Yawata (JP); Kazuya Niki, Hirakata (JP)

(73) Assignees: Sanyo Electric Co., Ltd., Moriguchi (JP); Sanyo Electronic Components Co., Ltd., Daito (JP)

(*) Notice: Subject to any disclaimer, the term of this patent is extended or adjusted under 35 U.S.C. 154(b) by 0 days.

(21) Appl. No.: 09/810,256

(22) Filed: Mar. 19, 2001

(65) Prior Publication Data

US 2001/0024149 A1 Sep. 27, 2001

(30) Foreign Application Priority Data

Mar. 21, 2000 (JP) ........................................ 2000-077970

(51) Int. Cl.⁷ ................................................. H03H 9/64
(52) U.S. Cl. ..................... 333/193; 333/196; 310/313 B
(58) Field of Search ................................. 333/193–196; 310/313, 313 R, 313 B, 313 C, 313 D

(56) References Cited

U.S. PATENT DOCUMENTS 5,581,141 A * 12/1996 Yamada et al. .......... 310/313 B
6,057,630 A * 5/2000 Yanagihara et al. ..... 310/313 B

FOREIGN PATENT DOCUMENTS

JP 03029407 A * 2/1991 .......... H03H/9/145

* cited by examiner

Primary Examiner—Barbara Summons
(74) Attorney, Agent, or Firm—Armstrong, Westerman & Hattori, LLP

(57) ABSTRACT

A SAW filter includes input and output IDTs and a pattern inductor connected in parallel with the output IDT. The pattern inductor is constructed of a metallic thin film pattern of meander type with a self-inductance amount of 20 nH for example.

7 Claims, 4 Drawing Sheets

SURFACE ACOUSTIC WAVE DEVICE WITH INDUCTOR MEANS FOR CORRECTING IMPEDANCE IMBALANCE BETWEEN INPUT AND OUTPUT ELECTRODES

BACKGROUND OF THE INVENTION

1. Field of the Invention

The present invention relates to surface acoustic wave (SAW) devices and particularly to a SAW filter applied to digital CATV (community antenna television, cable television) system.

2. Description of the Background Art

A SAW filter of transversal type has been known as one of SAW devices. The transversal SAW filter has a property that a desired characteristic can readily be accomplished by means of various weighting methods.

FIG. 6 shows a conventional SAW filter 1. Referring to FIG. 6, SAW filter 1 includes a piezoelectric substrate 2, an input IDT (interdigital transducer) 3, an output IDT 4, a shield electrode 5, and an adsorbing material 6. Input IDT 3 and output IDT 4 are constructed of interdigital electrodes.

The interdigital electrodes exhibit a basic property of generating surface acoustic waves as well as properties as electric capacitance. The electric capacitance is naturally generated because electrodes are arranged opposite each other with a short distance therebetween. It is thus impossible to control the capacitance independently of generation of surface acoustic waves. With a value of the naturally generated electric capacitance represented by $C_T$, the imaginary component of an input impedance of the electrode discussed above is expressed by $1/(j\omega \cdot C_T)$. When there is a great difference in this value of the imaginary component between input and output, the input and output accordingly have unbalanced impedances and a resultant filter characteristic exhibits a slope.

When SAW filter 1 shown in FIG. 6 is applied to an intermediate frequency (IF) for digital broadcasting, an extremely steep characteristic is required. Then, adjustment is difficult of a subtle impedance balance between input and output by means of only the weighting of interdigital electrodes.

Consequently, an impedance imbalance occurs between input and output that causes a slope of an inband characteristic as shown in FIG. 7, and thus insertion loss and inband ripple are deteriorated. The reason is that employment of a complex weighting function makes it impossible to cancel frequency characteristics of respective parasitic impedances of the input electrode (IDT) and the output electrode (IDT).

SUMMARY OF THE INVENTION

The present invention has been made to solve the problem above. One object of the invention is to eliminate the slope of the inband characteristic and accordingly improve the insertion loss and inband ripple by correcting an impedance imbalance between input and output electrodes.

A surface acoustic wave device according to the present invention includes a piezoelectric substrate, an input electrode (IDT) and an output electrode (IDT) formed on the piezoelectric substrate, and inductor means formed on the piezoelectric substrate for correcting an impedance imbalance between the input electrode and the output electrode.

The inductor means thus provided enables an inductance of a desired value to be added to the input electrode or the output electrode thereby changes an input impedance value. Specifically, when an element of self-inductance L is added in parallel to one of the electrodes, the imaginary component of an input impedance is defined by $1/\{j\omega \cdot C_T - j/(\omega L)\}$ and thus the input impedance value changes. In this way, inductor means having a proper self-inductance value can be provided so as to adjust the input impedance value to a desired value and accordingly correct an impedance imbalance between input and output electrodes.

A metallic pattern may be used as the inductor means. This metallic pattern is preferably a long metallic pattern of meander type or spiral type. The long metallic pattern has a great self-inductance so that the impedance imbalance between the input electrode and the output electrode can be corrected over a greater range.

Preferably, the inductor means is connected in parallel with the output electrode. Accordingly, the input impedance value can be controlled as discussed above and correction is possible of the impedance imbalance between the input and output electrodes.

The input and output electrodes are preferably interdigital electrodes, and a self-inductance value of the inductor means is determined to balance input impedance values of respective input and output electrodes.

The impedance imbalance between the input and output electrodes can thus be corrected.

The inductor means preferably has its self-inductance value from 10 nH to 100 nH. Further, the surface acoustic wave device of the invention is preferably applied to an intermediate frequency band of digital television system.

It has been known customarily that an electrode has an electric capacitance of approximately 1 pF in an intermediate frequency band (band of several tens of MHz) for images. In this case, an input impedance has its magnitude on the order of several ohms. For correcting the input impedance on the order of several ohms, an impedance should be added in parallel that is on the same order or greater by one order. The reason is that an impedance added thereto that is too great in magnitude substantially has no influence while an impedance added thereto that is too small in magnitude causes inversion of the sign of the impedance and accordingly the capacitive feature changes to an inductive feature. Regarding the intermediate frequency band, an impedance ranging from several ohms to several tens of ohms can be achieved with 10 nH to 100 nH. Accordingly, an impedance imbalance between input and output electrodes applied to the intermediate frequency band can be corrected by defining the self-inductance value of the inductor means as 10 nH to 100 nH.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
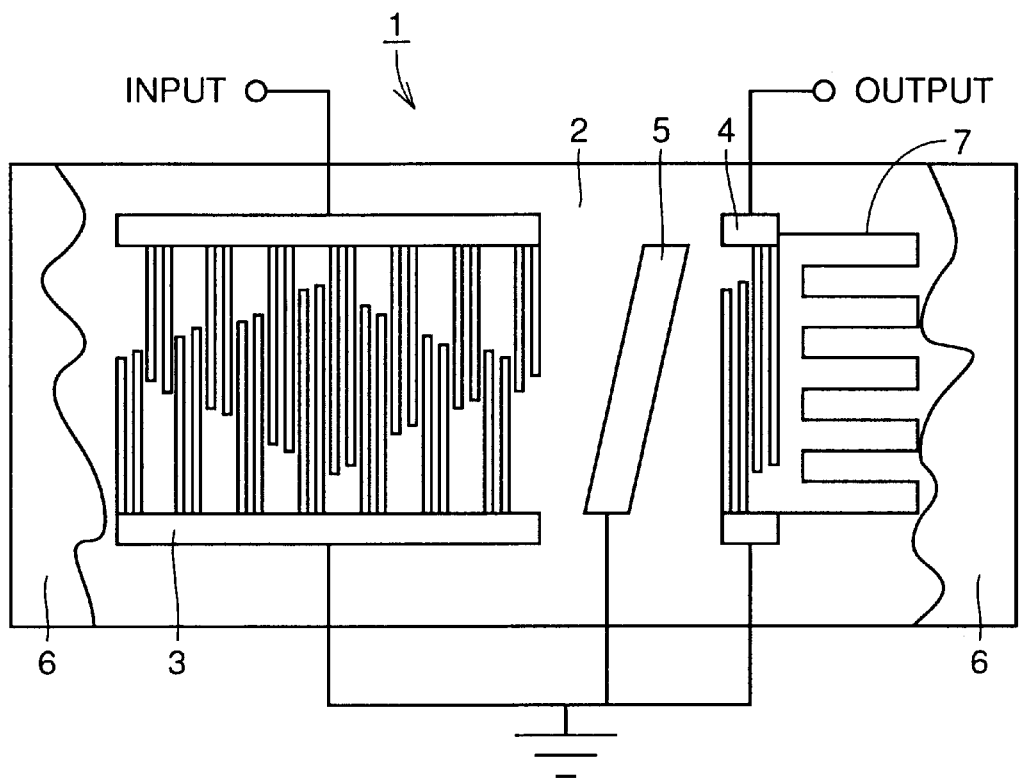
FIG. 1 schematically shows a structure of a SAW filter applied to digital CATV system according to the present invention.
Figure 2:
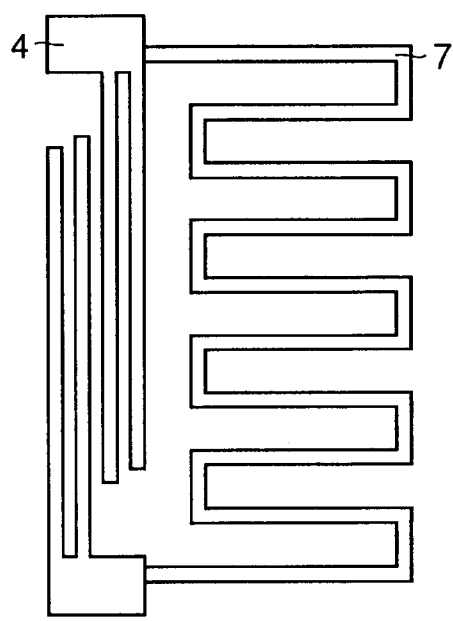
FIG. 2 is an enlarged view of an output IDT and a pattern inductor shown in FIG. 1.

An embodiment of the present invention is hereinafter described in conjunction with FIGS. 1–5. FIG. 1 is a plan view of a SAW filter 1 according to an embodiment of the invention.

SAW filter 1 according to the invention has an essential feature that inductor means is provided for correcting an impedance imbalance between input and output electrodes of interdigital structure (input and output IDTs 3 and 4).

Specifically, as shown in FIG. 1, a pattern inductor 7, one example of the inductor means, is provided to output IDT 4. Other structural components are substantially identical to those of the conventional filter shown in FIG. 5 and description thereof is not repeated here.

The provision of pattern inductor 7 accordingly makes it possible to add an inductance of a desired value to output IDT 4 thereby change an input impedance value. Specifically, with a self-inductance L of pattern inductor 7, the imaginary component of the input impedance is defined by $1/\{j\omega\cdot C_T - j/(\omega L)\}$. The input impedance value then changes from the input impedance defined without provision of the pattern inductor 7.

In this way, pattern inductor 7 of an appropriate self-inductance value can be provided to properly adjust the input impedance value. As a result, respective impedance values of input and output IDTs 3 and 4 can be balanced and thus correction is possible of an impedance imbalance between input and output IDTs 3 and 4.

Figure 4:
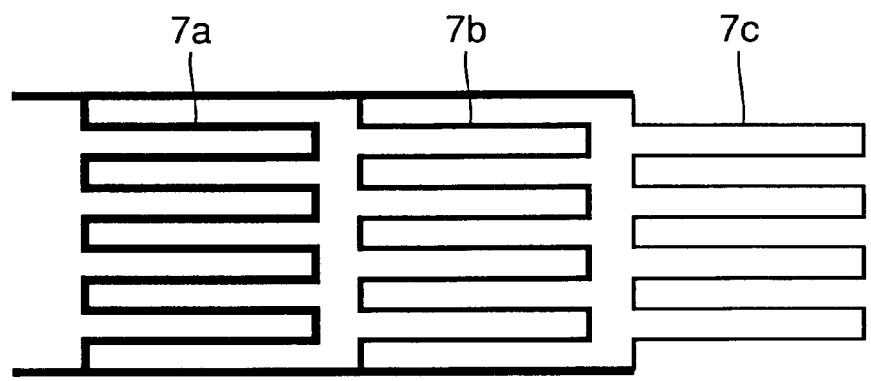
FIG. 4 shows an exemplary inductance adjustment mechanism.

A self-inductance adjustment mechanism according to the present invention is described in conjunction with FIG. 4. As shown in FIG. 4, meander patterns 7a, 7b and 7c having withstand voltage characteristics varied by means of material or line width are connected in parallel with output IDT 4, a direct-current voltage is applied thereto to successively disconnect these patterns and thus adjust the inductance.

For example, meander pattern 7a having its self-inductance of 30 nH, meander pattern 7b having its self-inductance of 60 nH and being disconnected with application of DC voltage 10 V, and meander pattern 7c having its self-inductance of 20 nH and being disconnected with application of DC voltage 1 V are employed.

Then, a self-inductance of 10 nH is achieved in an initial stage, a self-inductance of 20 nH is achieved by application of DC voltage 1 V to disconnect meander pattern 7c, and a self-inductance of 30 nH is achieved by application of DC voltage 10 V to disconnect meander patterns 7b and 7c.

The self-inductance adjustment mechanism thus employed enables an inductance of a desired value to be added to output IDT 4.

Figure 5:
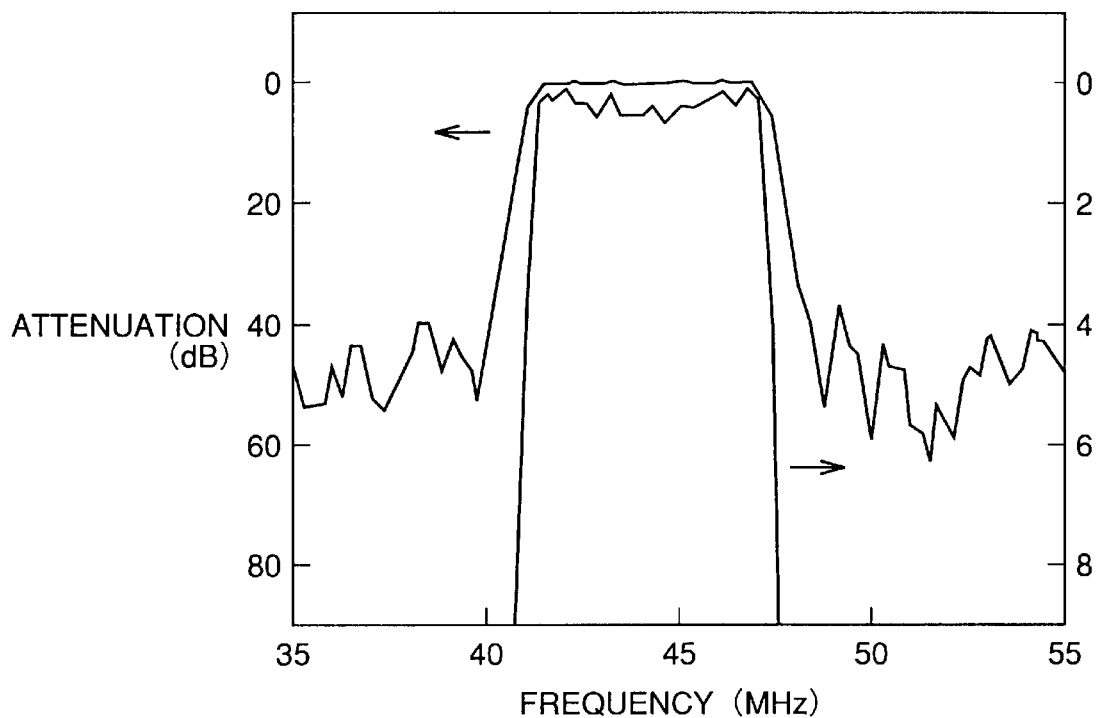
FIG. 5 shows a characteristic of the SAW filter applied to digital CATV system according to the invention.
Figure 6:
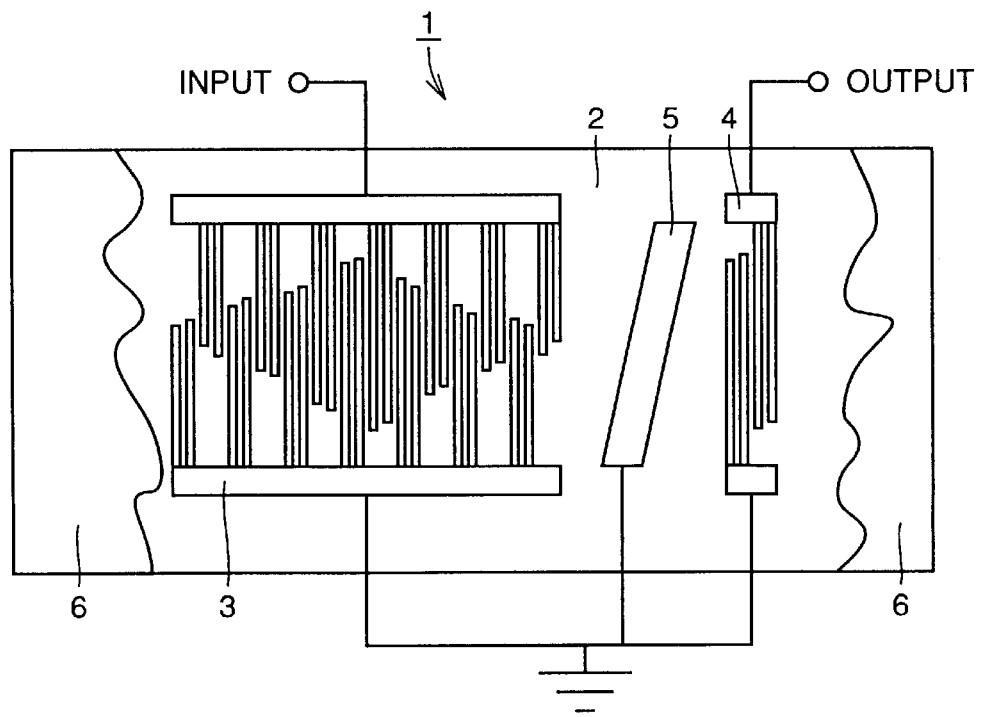
FIG. 6 schematically shows a structure of a conventional SAW filter applied to digital CATV system.
Figure 7:
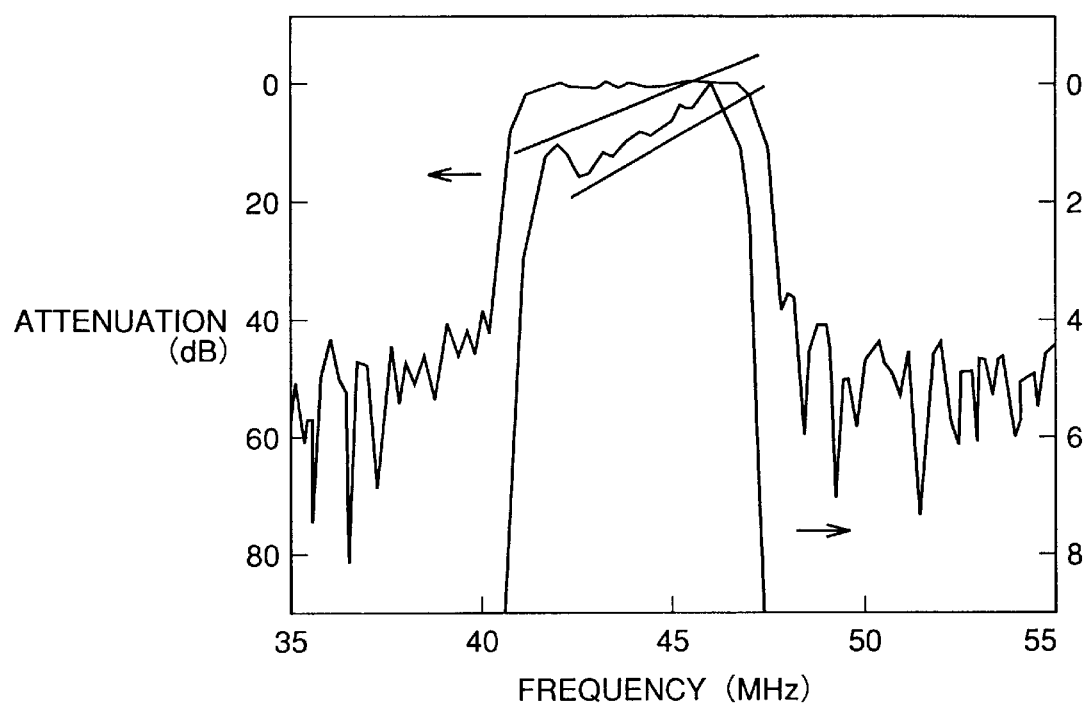
FIG. 7 shows a characteristic of the conventional SAW filter applied to digital CATV system.

FIG. 5 shows a characteristic of SAW filter 1 according to the invention. This characteristic is accomplished by setting the self-inductance amount of pattern inductor 7 at 20 nH.

It is seen from FIG. 5 that the inband characteristic has no slope. In other words, it is understood that provision of pattern inductor 7 as discussed above can correct an impedance imbalance between input and output IDTs 3 and 4 thus improvement is possible of insertion loss and inband ripple.

Figure 3:
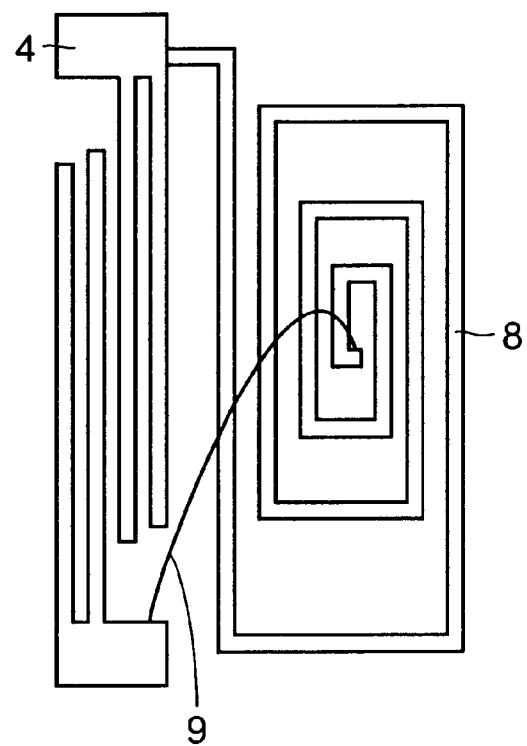
FIG. 3 shows a modification of the pattern inductor shown in FIG. 2.

Pattern inductor 7 connected in parallel with output IDT 4 as shown in FIG. 1 is structured of a metallic thin film pattern in this case. The pattern inductor 7 is of meander type when applied in the manner shown in FIGS. 1 and 2. Alternatively, a pattern inductor 8 of spiral type as shown in FIG. 3 may be employed. Namely, a pattern inductor is preferably formed of a long metallic thin film pattern.

The long metallic thin film pattern having a great self-inductance can be used as the pattern inductor as discussed above so as to correct an impedance imbalance between input and output IDTs 3 and 4 over an extended range. It is noted that a jumper 9 shown in FIG. 3 is required when the spiral type pattern inductor 8 is employed.

The self-inductance amount of pattern inductance 7 is 20 nH in the example shown in FIG. 5. The self-inductance amount of pattern inductance 7 may be in a range from 10 nH to 100 nH.

Filter 1 of the present invention is typically applied to an intermediate frequency band (band of several tens of MHz) for digital CATV system. It is customarily known that an interdigital electrode (IDT) has an electric capacitance of approximately 1 pF in this frequency band. An input impedance in this case has a magnitude on the order of several ohms.

In order to correct such an input impedance on the order of several ohms, addition of an impedance in parallel is necessary that is on the same order or greater by one order. It is because an impedance to be added that is too great in magnitude would substantially have no influence while an impedance to be added that is too small in magnitude would cause inversion of the sign of the impedance and accordingly the capacitive feature changes to an inductive feature.

With respect to frequencies of several tens of MHz, an inductance of 10 nH to 100 nH enables an impedance ranging from several ohms to several tens of ohms to be achieved. Then, a self-inductance amount of pattern inductor 7 can be set at 10 nH to 100 nH to correct an impedance imbalance between input and output IDTs 3 and 4 when filter 1 is used for the intermediate frequency band.

As heretofore discussed, according to the present invention, an impedance imbalance between input and output electrodes (IDTs) can be corrected. Consequently, elimination is possible of any slope of an inband characteristic and thus enhancement of insertion loss and inband ripple is possible.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A surface acoustic wave device, comprising:
   a piezoelectric substrate;
   an input electrode and an output electrode formed on said piezoelectric substrate;
   inductor means formed on said piezoelectric substrate for correcting an impedance imbalance between said input electrode and said output electrode;
   wherein said inductor means includes a plurality of metallic patterns connected in parallel with said output electrode.

2. A surface acoustic wave device, comprising:
   a piezoelectric substrate;
   an input electrode and an output electrode formed on said piezoelectric substrate; and inductor means formed on said piezoelectric substrate for correcting an impedance imbalance between said input electrode and said output electrode;

wherein said inductor means includes a metallic pattern; and wherein said metallic pattern is of a spiral type with a jumper connecting said output electrode and said metallic pattern.

3. A surface acoustic wave device, comprising:

a piezoelectric substrate;

an input electrode and an output electrode formed on said piezoelectric substrate; and inductor means formed on said piezoelectric substrate for correcting an impedance imbalance between said input electrode and said output electrode;

wherein said input electrode and said output electrode are interdigital electrodes, and said inductor means has a self-inductance value determined to balance respective input impedance values of said input electrode and said output electrode.

4. The surface acoustic wave device according to claim 3, wherein said metallic pattern is one of a meander type and a spiral type.

5. The surface acoustic wave device according to claim 3, wherein said inductor means is connected in parallel with said output electrode.

6. The surface acoustic wave device according to claim 3, wherein said inductor means includes a plurality of metallic patterns connected in parallel with said output electrode.

7. The surface acoustic wave device according to claim 3, wherein said inductor means has a self-inductance value of 10 nH to 100 nH.

\* \* \* \* \*